US007161435B2

(12) United States Patent
Konno (10) Patent No.: US 7,161,435 B2
(45) Date of Patent: Jan. 9, 2007

(54) FEEDBACK CONTROL CIRCUIT

(75) Inventor: Yoshiaki Konno, Isehara (JP)

(73) Assignee: Asahi Kasei Microsystems Co., Ltd., Tokyo (JP)

( * ) Notice: Subject to any disclaimer, the term of this patent is extended or adjusted under 35 U.S.C. 154(b) by 132 days.

(21) Appl. No.: 11/061,528

(22) Filed: Feb. 22, 2005

(65) Prior Publication Data

US 2006/0197606 A1    Sep. 7, 2006

(51) Int. Cl.
*H03L 7/00* (2006.01)
(52) U.S. Cl. .................... 331/16; 331/182; 331/183; 331/17; 331/1 A
(58) Field of Classification Search ............ 331/16, 331/182, 183, 17, 1 A
See application file for complete search history.

(56) References Cited

U.S. PATENT DOCUMENTS 6,163,186 A * 12/2000 Kurita ..................... 327/157

OTHER PUBLICATIONS

Kurosu, Shigeru, "Introduction to Control Engineering," pp. 77-86, 2nd Edition, POWERSHA Inc., May 30, 1994.

Green, Douglas N., "Global Stability Analysis of Automatic Gain Control Circuits," IEEE Transactions on Circuits and Systems, vol. CAS-30, No. 2, Feb. 1983, pp. 78-83.

Larsson, Patrjk, "Measurements and Analysis of PLL Jitter Caused by Digital Switching Noise," IEEE Journal of Solid-State Circuits, vol. 36, No. 7, Jul. 2001, pp. 1113-1119.

* cited by examiner

*Primary Examiner*—Robert Pascal
*Assistant Examiner*—Levi Gannon
(74) *Attorney, Agent, or Firm*—Finnegan, Henderson, Farabow, Garrett & Dunner LLP (57) ABSTRACT

The output amplitude of a variable gain amplifier is compared with a reference value by a differential amplifier. When the amplitude is less than the reference value, the gain of the variable gain amplifier is increased to augment the output amplitude. When the amplitude is greater than the reference value, the gain of the variable gain amplifier is decreased to reduce the output amplitude. Only part of the variable gain range of the variable gain amplifier is corresponded to the potential at VLP by installing an input switching unit for inverting the output polarity of the differential amplifier, an input switching unit for inverting the output polarity of a differential amplifier, comparator, an IDAC, and a logic circuit for controlling the ON and OFF of switches of the input switching units and the output current value of the IDAC.

3 Claims, 8 Drawing Sheets

FEEDBACK CONTROL CIRCUIT

BACKGROUND OF THE INVENTION

1. Field of the Invention

The present invention relates to a feedback control circuit, and more particularly to a feedback control circuit using an integrating circuit or a high frequency eliminating circuit.

2. Description of Related Art

Generally, the control that compares an output with a reference value and minimizes the difference between the two is know as PID (proportional-plus-integral-plus-derivative) control in the automatic control (for example, see, Shigeru Kurosu, "Introduction to Control Engineering" pp. 77–86, 2nd edition, POWERSHA Inc. May 30, 1994). In the field of electric circuits, the PID control is applied, for example, to AGC (Automatic Gain Control) (see, Green, D. "Global stability analysis of automatic gain control circuits" Circuits and Systems, IEEE Transactions on, Volume 30, Issue 2, February, 1983, pp. 78–83, for example), or to a PLL (Phase-Locked Loop) (see, Larsson, P. "Measurements and analysis of PLL jitter caused by digital switching noise" Solid-State Circuits, IEEE Journal of, Volume 36, Issue 7, July, 2001, pp. 1113–1119, for example).

Although the AGC or PLL uses an integrator or low-pass filter in the feedback control circuit, the output of the integrator or low-pass filter is limited within the power supply voltage of the circuit. Recently, in particular, the power supply voltage has been reduced with the scale down of circuit elements from the viewpoint of the withstanding voltage, and hence the ranges of the output voltages of circuits have also been reduced.

The control circuit controls the system in response to the output of the integrating circuit or low-pass filter. Accordingly, when the output range of the integrating circuit or low-pass filter is narrow, the control circuit must increase the gain to cover the required control range. Increasing the gain, however, presents a problem of greatly changing the state of the system because of noise added to the output of the integrating circuit or low-pass filter.

In addition, the integrator or low-pass filter includes a high impedance node, which is sensitive to noise. In addition, an external component such as a capacitor attached to the integrator or low-pass filter is subjected to circulate noise on a board. Even if all the components are integrated into an IC, the circulate noise from a substrate cannot be eliminated completely, and hence the integrator or low-pass filter is subjected to influences of the noise.

The present invention is implemented to solve the foregoing problems. It is therefore an object of the present invention to provide a noise-resistant feedback control circuit capable of suppressing the influence of noise even when the output of the integrating circuit or low-pass filter undergoes the noise by configuring the control system without increasing the gain after the integrating circuit or low-pass filter under the limited power supply voltage range as the output range the integrating circuit or low-pass filter.

SUMMARY OF THE INVENTION

The present invention is implemented to achieve the problems. According to an aspect of the present invention, there is provided a feedback control circuit including a controlled circuit controlled by a control value; a comparing means for comparing an output value of the controlled circuit with a reference value, and for outputting a differential signal corresponding to the difference; and filter means for carrying out integral of or eliminating high frequency components of a compared result obtained by the comparing means, the feedback control circuit controlling the controlled circuit in response to the control value corresponding to an output signal of the filter means, the feedback control circuit comprising; first inverting means for inverting a polarity of the differential signal when the output of the filter means becomes a predetermined value; second inverting means installed at a post-stage of the filter means, for inverting an output polarity of a signal based on the output signal of the filter means when the first inverting means inverts the polarity of the differential signal; and add-subtract means for generating, when the first inverting means inverts the polarity of the differential signal, the control value by adding to or subtracting from the signal inverted by the second inverting means a value of that signal at inversion, or a specified value.

Here, the filter means can include affixing means for attaching a zero to filter characteristics, and the feedback control circuit can further comprise: low-pass filter means for eliminating high frequency components from the output signal of the filter means unaffected by the zero; differential means for outputting a difference between the output signal of the filter means affected by the zero, and the output signal from the filter means unaffected by the zero; third inverting means for inverting, when the polarity of the differential signal is inverted, an output polarity of the differential means; and addition means for summing up an output of the add-subtract means and an output of the differential means, and for outputting the control value, wherein the signal whose output polarity is inverted by the second inverting means can be a signal based on the output of the low-pass filter means.

The feedback control circuit can constitute a phase-locked loop (PLL).

According to the present invention, the feedback control circuit includes first inverting means for inverting a polarity of the differential signal when the output of the filter means becomes a predetermined value; second inverting means installed at a post-stage of the filter means, for inverting an output polarity of a signal based on the output signal of the filter means when the first inverting means inverts the polarity of the differential signal; and add-subtract means for generating, when the first inverting means inverts the polarity of the differential signal, the control value by adding to or subtracting from the signal inverted by the second inverting means a value of that signal at inversion, or a specified value. Therefore it can reduce the influences of the disturbance, which is added to the integrating circuit or high frequency eliminating circuit, on the output to a fraction of the conventional system with using the same voltage range as the output range of the integrating circuit or high frequency eliminating circuit.

The above and other objects, effects, features and advantages of the present invention will become more apparent from the following description of embodiments thereof taken in conjunction with the accompanying drawings.

DETAILED DESCRIPTION OF THE PREFERRED EMBODIMENTS

The invention will now be described with reference to the accompanying drawings.

Figure 1:
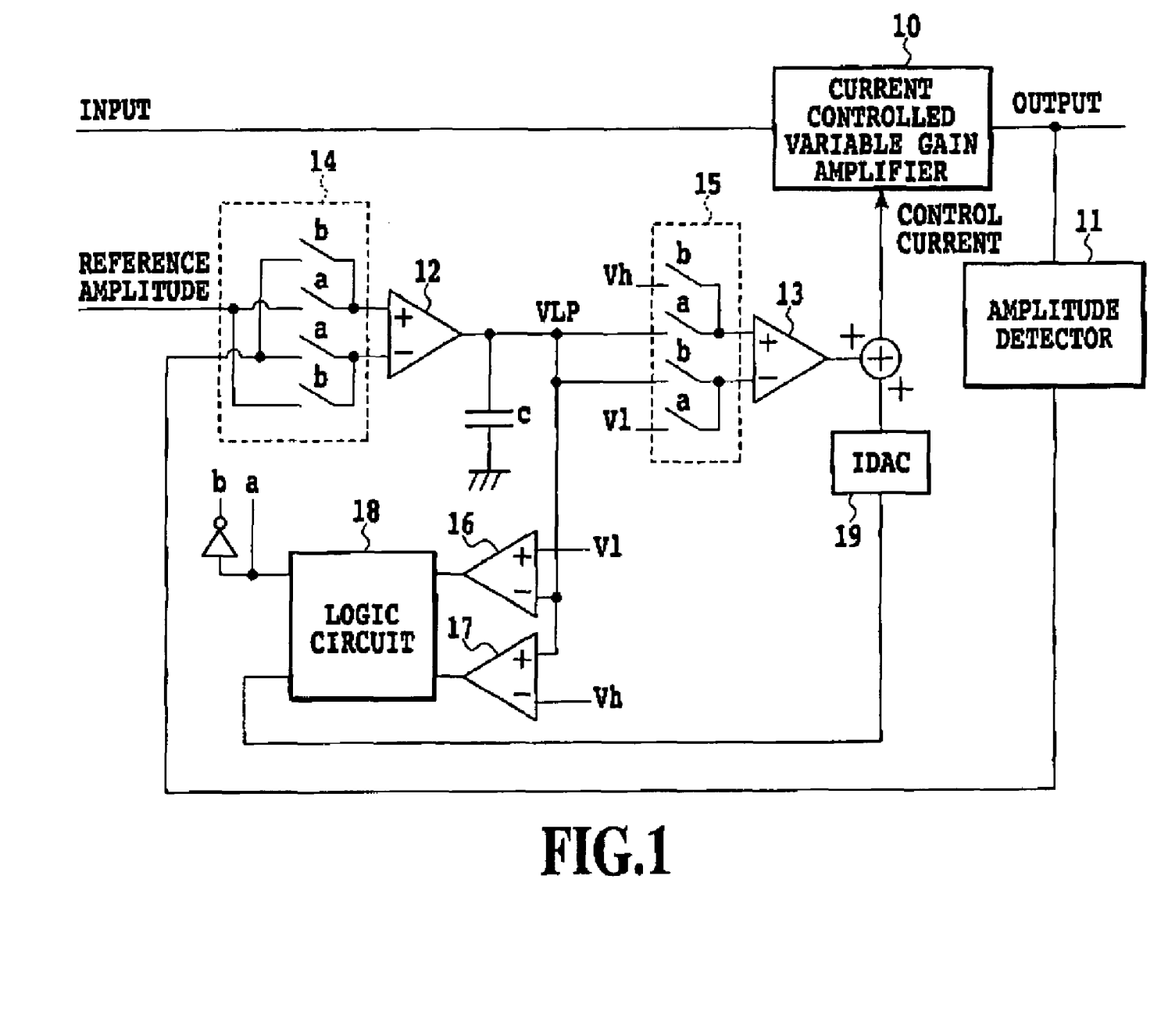
FIG. 1 is a block diagram showing a configuration of an embodiment 1 of a feedback control circuit in accordance with the present invention.
Figure 2:
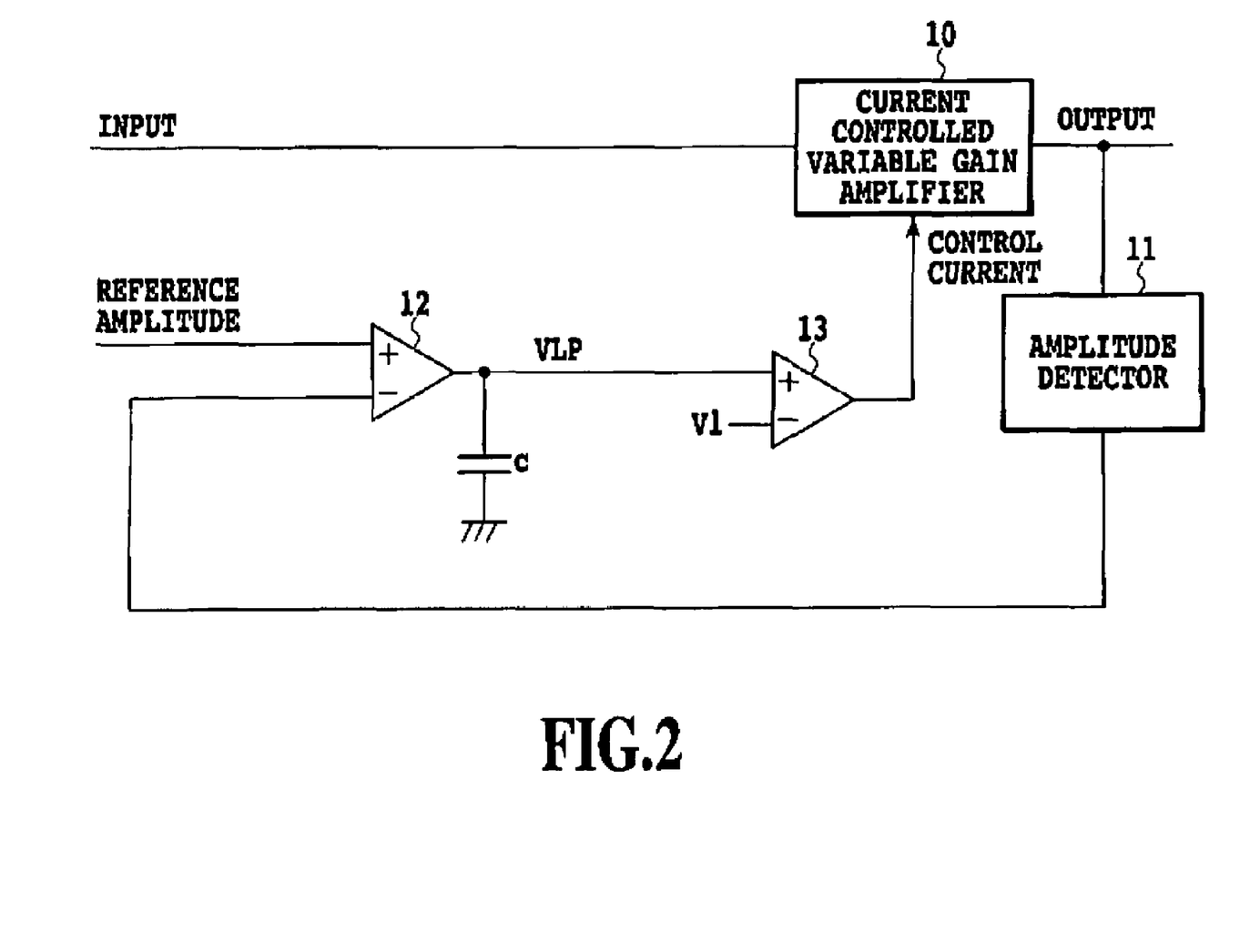
FIG. 2 is a block diagram showing a basic configuration of the embodiment 1 as shown in FIG. 1.

FIG. 1 is a block diagram showing a configuration of an embodiment of a feedback control circuit in accordance with the present invention. FIG. 2 is a block diagram showing a basic configuration of the embodiment 1 as shown in FIG. 1. The feedback control circuit has a function that maintains its output amplitude at a target level even if the input signal amplitude varies.

In FIGS. 1 and 2, the reference numeral 10 designates a current controlled variable gain amplifier; 11 designates an amplitude detector; reference numerals 12 and 13 each designate a current output type differential amplifier; 14 and 15 each designate an input switching unit; 16 and 17 each designate a comparator; the reference numeral 18 designates a logic circuit; and 19 designates an IDAC (current output type DA converter).

First, a basic configuration of the embodiment 1 shown in FIG. 2 will be described.

The input signal is input to the variable gain amplifier 10, the gain of which is increased or decreased in proportion to the control current. The amplitude detector 11 detects the output amplitude of the variable gain amplifier 10, and the differential amplifier 12 compares that level with a reference value.

As a result of the comparison of the differential amplifier 12, if the amplitude is smaller than the reference value, a current flows from the differential amplifier 12 to the capacitor C, and the potential at VLP increases. When the potential at VLP rises, the output current of the differential amplifier 13 increases, and the gain of the variable gain amplifier 10 increases, thereby augmenting the output amplitude.

In contrast, if the amplitude is greater than the reference value, a current flows from the capacitor C to the differential amplifier 12, and the potential at VLP decreases. When the potential at VLP decreases, the output current of the differential amplifier 13 decreases, and the gain of the variable gain amplifier 10 decreases, thereby reducing the output amplitude. Thus, the feedback control keeps the output amplitude equal to the reference value.

The range of the potential at VLP, which is determined by the output range of the differential amplifier 12 or the input range of the differential amplifier 13, is usually in the range within the power supply voltage. Assume that the range has an upper limit potential Vh, and a lower limit potential Vl. Usually, the lower limit and upper limit correspond to the upper limit and lower limit of the gain of the variable gain amplifier.

The present embodiment 1 includes, besides the basic configuration as shown in FIG. 2, the input switching unit 14 for inverting the output polarity of the differential amplifier 12; the input switching unit 15 for inverting the output polarity of the differential amplifier 13; the IDAC (current output type DA converter) 19; the comparators 16 and 17 for comparing the potential at VLP with Vh and Vl; and the logic circuit 18 for controlling the switching ON and OFF of input switching units 14 and 15 and the output current value of the IDAC 19 when VLP reaches Vh or Vl. In the present embodiment 1, only part of the variable range of the variable gain amplifier 10 corresponds to the potential at VLP.

Detecting a leading edge of the comparators 16 and 17, the logic circuit 18 inverts the ON and OFF states of the switches "a" and "b" of the input switching units 14 and 15. During the time when the switches "a" are in the ON state and the switches "b" are in the OFF state, the logic circuit 18, detecting the leading edge of the comparator 16, decreases the output of the IDAC 19 by Gm·(Vh−Vl) (where Gm is the voltage-to-current conversion coefficient of the differential amplifier 13), and detecting the leading edge of the comparator 17, increases the output of the IDAC 19 by Gm·(Vh−Vl).

In contrast with this, during the time when the switches "a" are in the OFF state and the switches "b" are in the ON state, detecting the leading edge of the comparator 16, the logic circuit 18, detecting the leading edge of the comparator 16, increases the output of the IDAC 19 by Gm·(Vh−Vl), and detecting the leading edge of the comparator 17, decreases the output of the IDAC 19 by Gm·(Vh−Vl).

In other words, the feedback control circuit of the embodiment 1 in accordance with the present invention has the variable gain amplifier 10 (controlled circuit) controlled by a certain control value; the differential amplifier 12 (comparing means) for comparing the output value of the variable gain amplifier 10 with the reference value, and for outputting a differential signal corresponding to the difference; and the capacitor C (filter means) for integrating the comparing result by the differential amplifier 12 or eliminating the high frequency components. In addition, the feedback control circuit, which controls the variable gain amplifier 10 in response to the control value corresponding to the output signal of the capacitor C, has the first input switching unit 14 (first inverting means), the second input switching unit 15 (second inverting means), and the logic circuit 18 (add-subtract means).

The first input switching unit 14 inverts the polarity of the differential signal when the output of the capacitor C becomes the specified value. The second input switching unit 15, which is installed at a post-stage of the capacitor C, inverts the output polarity of the signal based on the output signal VLP of the capacitor C when the polarity of the differential signal is inverted by the first input switching unit 14. The logic circuit 18 generates, when the polarity of the differential signal is inverted, the control value by adding to or subtracting from the signal inverted by the second input switching unit 15 the value of that signal at the inversion or specified value.

Figure 3:
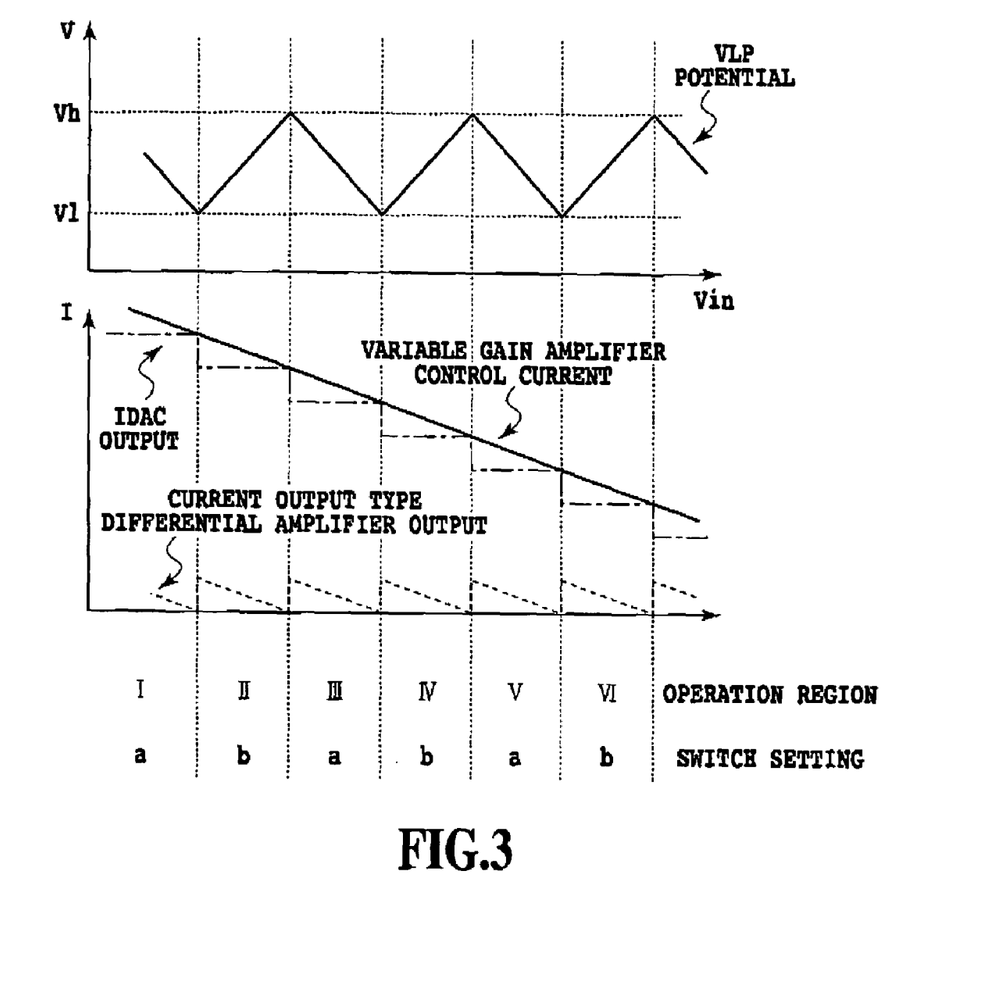
FIG. 3 is a graph illustrating relationships of the input signal amplitude, the potential at a capacitor C and the control current of a variable gain amplifier, and ON and OFF states of individual switches.

FIG. 3 is a graph illustrating the relationships of the input signal amplitude with the potential at C and the control current of the variable gain amplifier along with the ON and OFF states of the individual switches. Specifically, it illustrates the relationships of the input amplitude with the state of the VLP potential input switching unit, the output current of the current output type differential amplifier, the output of the IDAC (current output type DA converter), and the control current of the current controlled variable gain amplifier in the embodiment 1. Referring to FIG. 3, the operation of the embodiment 1 will now be described.

First consider the case where the system is in the operation region I, and the input amplitude increases gradually. In this case, the potential at VLP and hence the output current of the differential amplifier 13 decrease, and the gain of the variable gain amplifier 10 and hence the output amplitude decrease, thereby maintaining the output amplitude at a fixed value. When the potential at VLP reaches Vl, the comparator 16 becomes the "H" level. Detecting the leading edge of the comparator 16, the logic circuit 18 changes the switches "a" of the input switching units 14 and 15 from the ON state to the OFF state, and the switches "b" from the OFF state to the ON state, and reduces the output of the IDAC 19 by Gm·(Vh–Vl).

Subsequently, the operation region shifts from I to II, in which the potential at VLP turns to increase, and the output of the comparator 16 returns to the "L" level. In addition, since the differential amplifier 13 inverts its output polarity and varies its output from zero to Gm·(Vh–Vl), the control current of the variable gain amplifier 10 continues to decrease. When the input amplitude further increases, and the potential at C reaches Vh, the comparator 17 becomes the "H" level. Detecting the leading edge of the comparator 17, the logic circuit 18 changes the switches "a" of the input switching units 14 and 15 from the OFF state to the ON state, and the switches "b" from the ON state to the OFF state, and reduces the output of the IDAC 19 by Gm·(Vh–Vl).

Subsequently, the operation region shifts from II to III, in which the potential at VLP turns to decrease, and the output of the comparator 17 returns to the "L" level. In this case, since the differential amplifier 13 inverts its output polarity and varies its output from zero to Gm·(Vh–Vl), the control current of the variable gain amplifier 10 continues to decrease. Thus, the increase in the input amplitude further reduces the control current value.

On the other hand, the potential at VLP travels between Vh and Vl with making a fold. Thus, setting the number of folds at N means that 1/(N+1) of the gain range G of the variable gain amplifier 10 corresponds to the operation range of each VLP. When the variable range G of the variable gain amplifier 10 corresponds to the voltage range Vh–Vl of VLP without a fold, the gain variations due to noise Vn added to VLP is Vn·G/(Vh–Vl). In contrast, folding the voltage range N times can reduce the gain range corresponding to the voltage range Vh–Vl to 1/(N+1), and hence the gain variations due to noise is reduced to Vn·G/[(Vh–Vl)·(N+1)] thereby being able to reduce the gain variations against the disturbance by a factor of (N+1). Although the noise deteriorates the S/N or distortion of the output, the present embodiment 1 can suppress it 1/(N+1) of the compared example by setting the number of folds at N.

Figure 4:
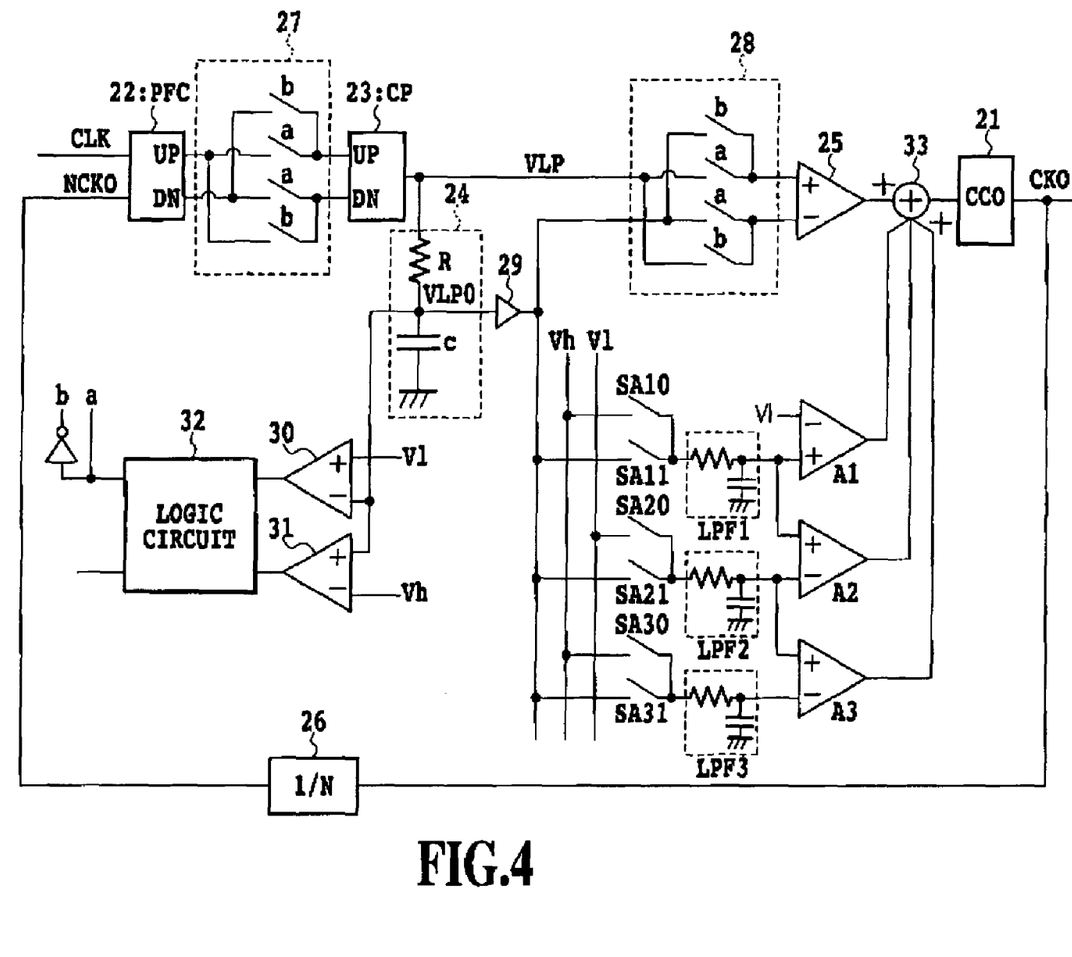
FIG. 4 is a block diagram showing a configuration of an embodiment 2 of a feedback control circuit in accordance with the present invention.
Figure 5:
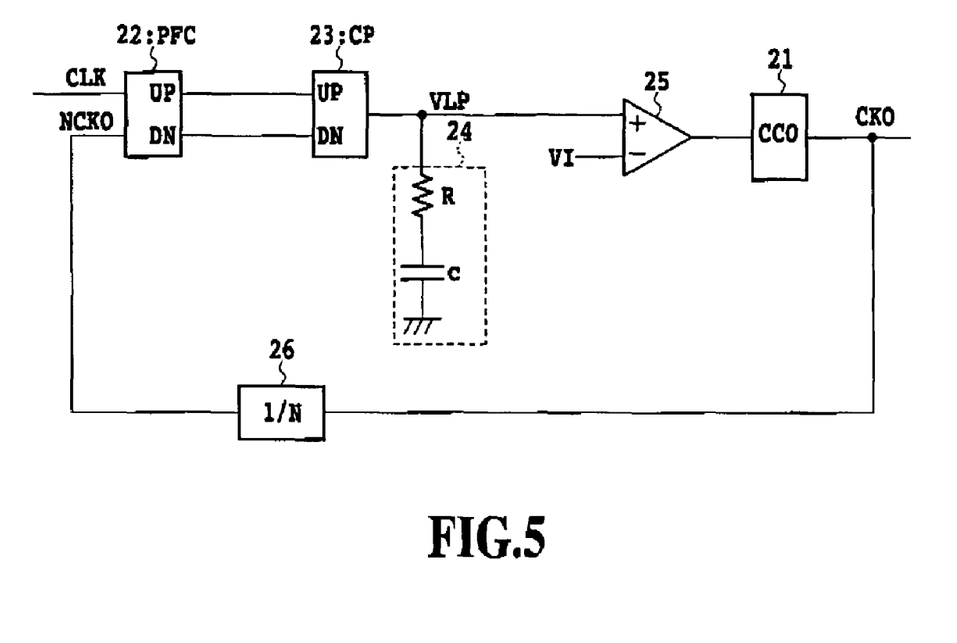
FIG. 5 is a block diagram showing a basic configuration of the embodiment 2 as shown in FIG. 4.

FIG. 4 is a block diagram showing a configuration of a second embodiment of the feedback control circuit in accordance with the present invention; and FIG. 5 is a block diagram showing a basic configuration of the embodiment 2 as shown in FIG. 4. In these figures, the reference numeral 21 designates a CCO (current controlled oscillator), 22 designates a PFC (phase frequency comparator), 23 designates a CP (charge pump), 24 designates a loop filter, 25 designates a current output type differential amplifier, 26 designates a frequency divider, reference numerals 27 and 28 each designate an input switching unit, the reference numeral 29 designates a buffer, reference numerals 30 and 31 each designate a comparator and the reference numeral 32 designates a logic circuit.

The present embodiment is a PLL. The PLL includes an oscillator and a phase comparator, and can be considered to have an additional integrator because the phase is represented by the integral of the frequency.

First, the basic configuration of the embodiment 2 as shown in FIG. 5 will be described.

The PFC 22 compares the phase of an input clock CLK with the phase of a clock NCKO obtained by dividing the output CKO of the CCO by N by the frequency divider 26. When the CLK leads the NCKO in the phase, the PFC 22 sets the UP output at the "H" level for an interval corresponding to the phase difference, and when the CLK lags behind the NCKO in the phase, the PFC 22 sets the DN output at the "H" level for an interval corresponding to the phase difference. The CP 23 outputs a current Icp when UP is at the "H" level and a current –Icp when DN is at the "H" level, and outputs zero when both the UP and DN are at the "H" level or at the "L" level.

The loop filter 24, which consists of a capacitor C and a resistor R, integrates the phase comparing result by storing the charge, that is, the current output for the time corresponding to the phase difference, into the capacitor C. The transfer function representing the open loop characteristic of the PLL is given by $(Icp/2\pi) \cdot R \cdot (1+1/sRC) \cdot Gm \cdot K/s \cdot (1/N)$, where K is the gain of the CCO 21, and Gm is the voltage-to-current conversion coefficient of the differential amplifier 25.

Figure 6:
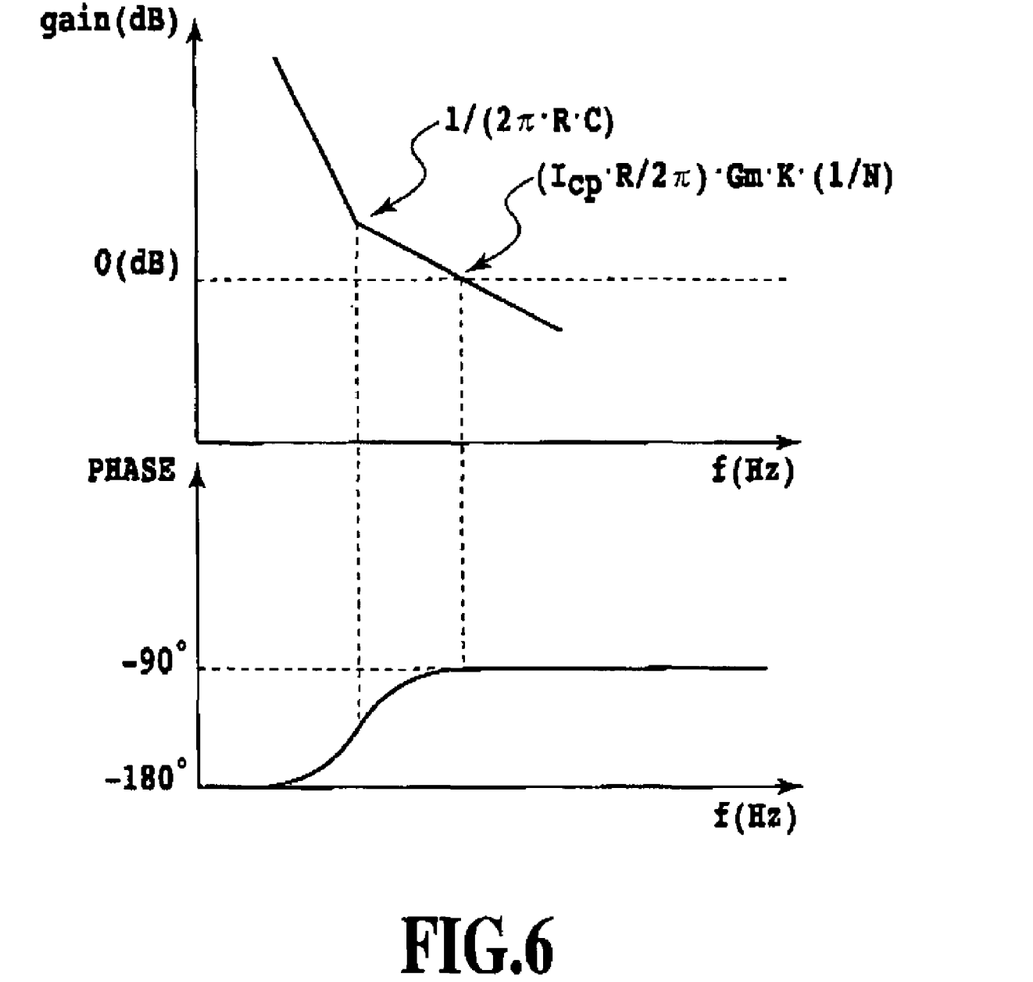
FIG. 6 is a graph illustrating open loop frequency characteristics of the basic configuration of the embodiment 2.

FIG. 6 is a graph illustrating open loop frequency characteristics of the basic configuration of the embodiment 2 as shown in FIG. 5. As illustrated in FIG. 6, R makes zero, and the phase delayed by the integration effect of the CCO 21 is advanced to ensure the stability of the loop.

The present embodiment 2 comprises, in addition to the basic configuration as shown in FIG. 5, the input switching unit 27 for inverting the output polarity of the phase frequency comparator 22; the modified differential amplifier 25 for carrying out the V-I conversion of the difference between the output signal VLP0 of the loop filter 24 and the potential at VLP; the input switching unit 28 for inverting the output polarity of the differential amplifier 25; the low-pass filters LPF1–LPF3 for removing the high frequency components of the output signal VLP0 fed from the loop filter 24; the switches SA10, SA20 and SA30, and SA11, SA21 and SA31 for inverting the signal based on VLP0 and holding the output at the inversion by selecting one of VLP0, Vh and Vl as an input to the low-pass filters LPF1–LPF3; the differential amplifiers A1, A2 and A3 for carrying out the V-I conversion of the output signals of the low-pass filters LPF1–LPF3; the comparators 30 and 31 for comparing the potential of the output signal VLP0 of the loop filter 24 with Vh and Vl; the logic circuit 32 for detecting the leading edges of the comparators 30 and 31, and for controlling the inputs to the input switching units 27 and 28 and to the current output type differential amplifiers A1, A2 and A3; and the current adder 33 for summing up the output currents of the differential amplifier 25 and of the current output type differential amplifiers A1, A2 and A3.

In other words, the feedback control circuit of the embodiment 2 in accordance with the present invention has, in addition to the embodiment 1, the resistor making a zero in the loop filter 24, the low-pass filters LPF1–LPF3, the differential amplifier 25 (differential means), the input switching unit 28 (third inverting means), and the current adder 33 (addition means).

The loop filter 24 includes the resistor R as an affixing means for making the zero. In addition, the low-pass filters LPF1–LPF3 remove the high frequency components from the output of the loop filter 24 to which the zero is not attached. The differential amplifier 25 (differential means) outputs the difference between the output signal VLP of the loop filter 24 to which the zero is attached and the output signal VLP0 of the loop filter 24 to which the zero is not attached. The input switching unit 28 (third inverting means) inverts the output polarity of the differential amplifier 25 when the polarity of the differential signal is inverted. The current adder 33 sums up the output signal of the differential amplifier 25 and the output signals of the current output type differential amplifiers A1, A2 and A3.

Figure 7:
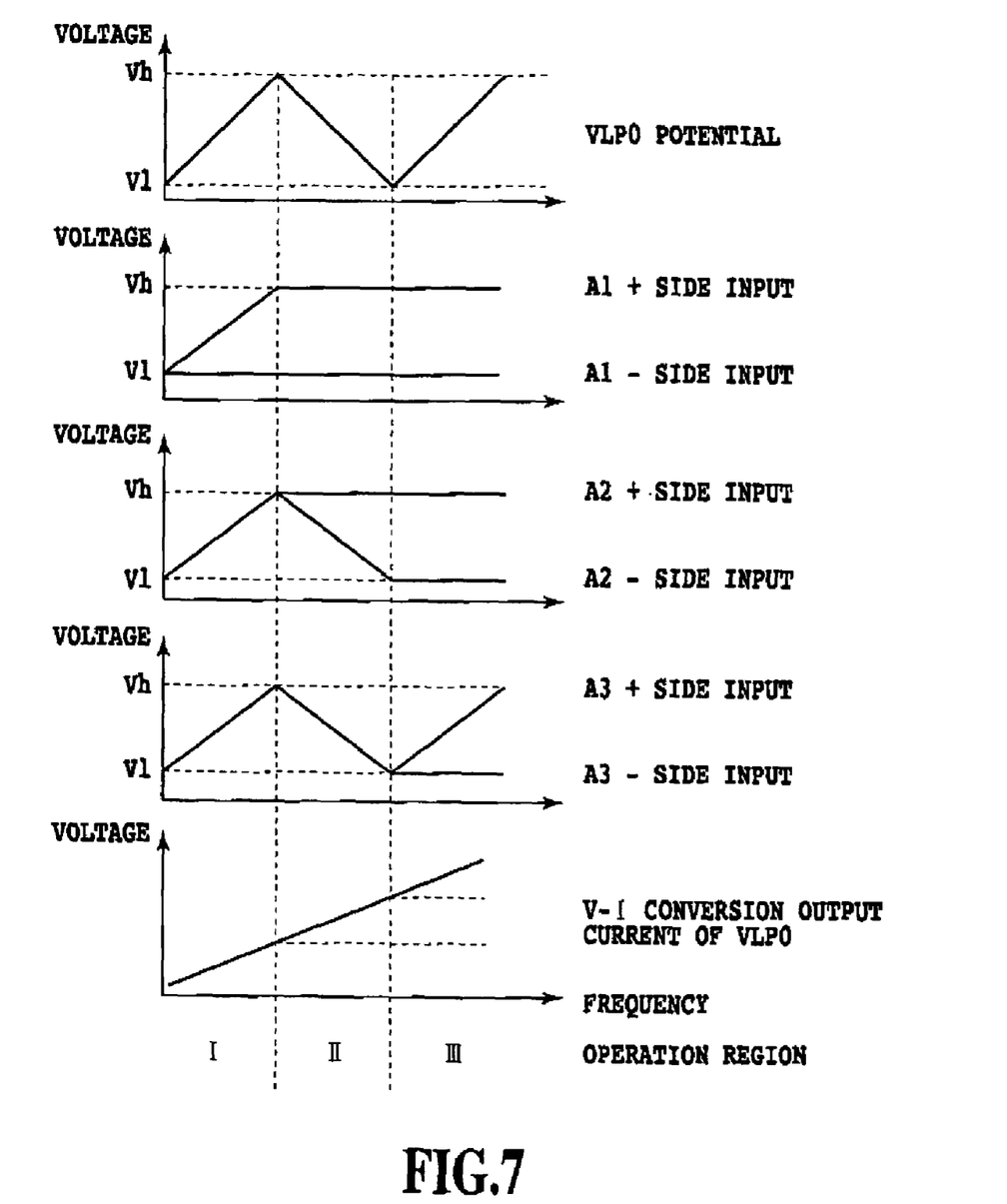
FIG. 7 is a diagram illustrating the operation of a section for carrying out V-I conversion of the VLP0 potential of the embodiment 2.

FIG. 7 is a diagram illustrating the operation of the portion for carrying out the V-I conversion of the VLP0 potential of the embodiment 2. Referring to FIG. 7, the operation of the embodiment 2 will be described.

First, assume that the present operation is in the operation region I, the switches "a" of the input switching units 27 and 28 are in the ON state and the switches "b" are in the OFF state, and the switches SA10, SA20 and SA30 for selecting the inputs of the differential amplifiers A1, A2 and A3 are in the OFF state and the switches SA11, SA21 and SA31 are in the ON state. The potential at VLP is the sum of the potential difference between VLP0 and VLP, and the potential of VLP0. When the output of the CP 23 is inverted, the output polarity of the differential amplifier 25 is also inverted. Accordingly, the description here is made by focusing attention on the operation of the differential amplifiers A1, A2 and A3 for carrying out the V-I conversion of the potential VLP0.

As the frequency of CLK is gradually increased, the potential VLP0 supplied with charges from the CP 23 rises. As for the differential amplifiers A2 and A3, since their inputs are short-circuited, their outputs are zero. The differential amplifier A1 outputs a current corresponding to the potential difference VLP0–Vl. When the potential VLP0 reaches Vh, the switches "a" of the input switching units 27 and 28 are turned off, and the switches "b" are turned on, SA10 is turned on and SA11 is turned off, thereby being shifted to the region II. The switches SA20 and SA30 are kept in the OFF state, and SA21 and SA31 are kept in the ON state. Since the output of the CP 23 is inverted, although the VLP0 potential decreases, the differential amplifier A2 outputs the current corresponding to the potential difference Vh–VLP0, and the differential amplifier A1 keeps the output at the time of switching because its input is fixed at Vh–Vl. As for the differential amplifier A3, since its input is short-circuited, its output is zero.

Thus, the V-I conversion output continues to increase even when the VLP0 potential makes a fold. As the frequency increases further, and when the VLP0 potential reaches Vl, the switches "a" of the input switching units 27 and 28 are turn on, the switches "b" are turn off, SA20 is turn on and SA21 is turn off. The switches SA11 and SA30 maintain the OFF state and SA10 and SA31 maintain the ON state. Since the output of the CP 23 is inverted, the VLP0 potential increases. Thus, the differential amplifier A3 outputs the current corresponding to the potential difference VLP0–Vl. Since the inputs of the differential amplifiers A1 and A2 are fixed at Vh–Vl, they hold the outputs at the time of switching. Thus, the V-I conversion output continues to increase even when the VLP0 potential makes a fold.

In this way, although the loop filter potential makes a fold, the control current of the CCO 21 continues to increase so that even if disturbance is added to the potential of the loop filter 24, the frequency variations of the output can be reduced to ⅓ of the conventional system. Although the present embodiment 2 has three differential amplifiers A1, A2 and A3 for carrying out the V-I conversion of the VLP0 potential, the number of the differential amplifiers can be increased as needed to increase the number of folds, thereby being able to further suppress the influence of the noise.

Although the present embodiment is described by way of example that uses the current adder 33 for summing up the output signal of the differential amplifier 25 and the output signals of the current output type differential amplifiers A1, A2 and A3, the summing up of the currents can be implemented by directly connecting the output terminal of the differential amplifier 25 with the output terminals of the current output type differential amplifiers A1, A2 and A3.

As explained in the description with reference to FIG. 7, the function corresponding to the second inverting means and the function corresponding to the addition and subtraction of the signal inverted by the second inverting means and the value of that signal at the time of inversion can be implemented by the combination of the switches SA10–SA31 and differential amplifiers A1–A3.

The second inverting means, which has a function of inverting the low-pass output, is implemented by the switches SA10–SA31 and differential amplifiers A1–A3. As for the output of the differential amplifier A1 when the switch SA11 is in the ON state, and the output of the differential amplifier A2 when the switch SA21 is in the ON state, since their polarity at the input terminals are opposite (A1 is plus and A2 is minus), the polarity of the signal based on the low-pass output is inverted by turning off the switch SA11, and turning on the switch SA21.

Since the switch SA11 is turned off, and the switch SA10 is turned on simultaneously with the inverting operation, the input of the differential amplifier A1 is fixed to Vh–Vl. Since the inversion is carried out when VLP0 reaches Vh, it implements the function of adding the value at the time of inversion of the output inverted by the second inverting means at the time of inversion.

In other words, as illustrated in FIG. 7, in the region I, the output of the differential amplifier A1 carries out the V-I conversion of the low-pass output; and in the region II, the output of the differential amplifier A2 carries out the V-I conversion by inverting the low-pass output. In this case, since the output of the differential amplifier A1 holds the value at the time of inversion, it sums up the output of the differential amplifier A1 and that of the differential amplifier A2 to realize the function of the add-subtract means.

As for the buffer 29 through which the potential VLP0 is supplied to the low-pass filters LPF1–LPF3 as shown in FIG. 4, it can be omitted when the capacitor of the low-pass filters LPF1–LPF3 is small enough compared with the capacitor C of the loop filter 24.

Even if Vh or Vl not the same as VLP0 at the folding points because of the offset of the comparators, the low-pass filters LPF1–LPF3 can suppress sudden variations in the outputs of the differential amplifiers A1, A2 and A3. Setting the cutoff frequency of the low-pass filters LPF1–LPF3 lower than the unity gain frequency of the PLL makes it possible for the PLL to compensate for the difference at the folding points. Accordingly, even if the potential difference occurs before and after the folds, it doesn't affect the output. In addition, it is preferable to set the cutoff frequency higher than the zero point frequency so that the poles caused by the low-pass filters LPF1–LPF3 do not affect the stability of the PLL.

To match the input impedance of the differential amplifier A1 to that of A2 or A3 seen from Vh, Vl or the buffer 29, or to match the coupling between the substrate and the individual inputs of the differential amplifier A1 and those of A2 and A3, it is possible to interpose the same low-pass filter as other inputs between the negative input of A1 and Vl. In addition, when no difference occurs at the folding ponts, or no practical problem occurs even if the difference occurs, the low-pass filters can be omitted.

Figure 8:
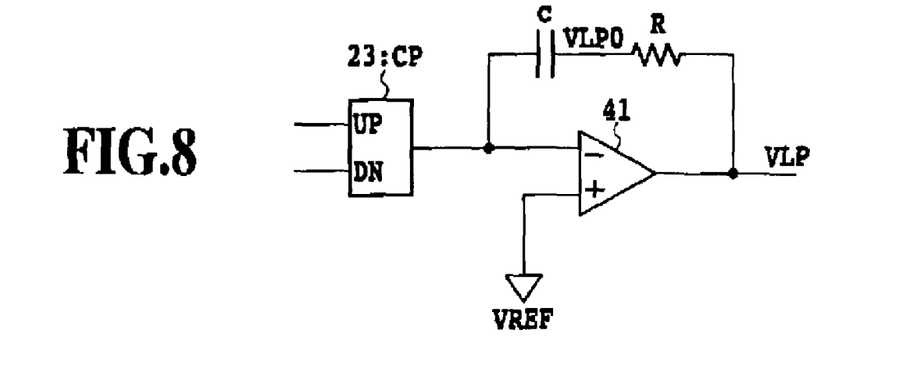
FIG. 8 is a circuit diagram showing another configuration of a loop filter in accordance with the present invention.
Figure 9:
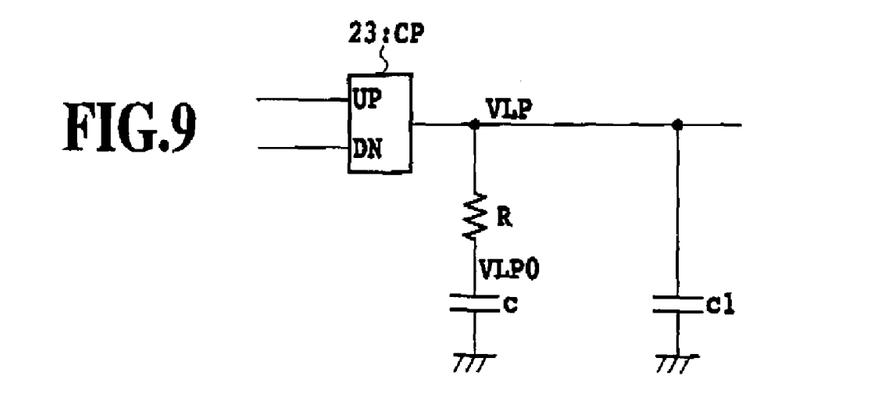
FIG. 9 is a circuit diagram showing still another configuration of the loop filter in accordance with the present invention.
Figure 10:
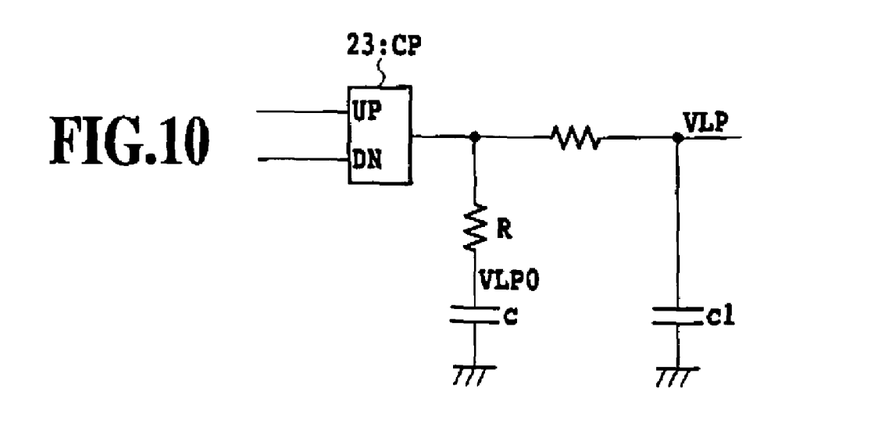
FIG. 10 is a circuit diagram showing still another configuration of the loop filter in accordance with the present invention.

Although the loop filter 24 consists of the resistor R and capacitor C in the basic configuration of the embodiment 2 as shown in FIG. 5, it can be configured by using an operational amplifier 41 as shown in FIG. 8. Alternatively, although it is also possible to add a capacitor C1 to VLP besides the capacitor C as shown in FIG. 9, or to add a low-pass filter to eliminate the frequency components higher than the bandwidth of the PLL as shown in FIG. 10, the method of the present embodiment is also applicable in such cases.

The feedback control circuit in accordance with the present invention is applicable to an amplitude adjusting circuit or PLL that uses an integrator in the control circuit, and particularly it is most suitable for the circuit that cannot take the large integrator output range because of the low power supply voltage or the like.

The present invention has been described in detail with respect to preferred embodiments, and it will now be apparent from the foregoing to those skilled in the art that changes and modifications may be made without departing from the invention in its broader aspect, and it is the intention, therefore, in the apparent claims to cover all such changes.

What is claimed is:

1. A feedback control circuit including a controlled circuit controlled by a control value; a comparing means for comparing an output value of the controlled circuit with a reference value, and for outputting a differential signal corresponding to the difference; and filter means for carrying out integral of or eliminating high frequency components of a compared result obtained by the comparing means, said feedback control circuit controlling the controlled circuit in response to the control value corresponding to an output signal of the filter means, said feedback control circuit comprising:
   first inverting means for inverting a polarity of the differential signal when the output of said filter means becomes a predetermined value;
   second inverting means installed at a post-stage of said filter means, for inverting an output polarity of a signal based on the output signal of said filter means when said first inverting means inverts the polarity of the differential signal; and
   add-subtract means for generating, when said first inverting means inverts the polarity of the differential signal, the control value by adding to or subtracting from the signal inverted by said second inverting means a value of that signal at inversion, or a specified value.

2. The feedback control circuit as claimed in claim 1, wherein
   said filter means includes affixing means for attaching a zero to filter characteristics, and said feedback control circuit further comprises:
   low-pass filter means for eliminating high frequency components from the output signal of said filter means unaffected by the zero;
   differential means for outputting a difference between the output signal of said filter means affected by the zero, and the output signal from said filter means unaffected by the zero;
   third inverting means for inverting, when the polarity of the differential signal is inverted, an output polarity of said differential means; and
   addition means for summing up an output of said add-subtract means and an output of said differential means, and for outputting the control value, and wherein
   the signal whose output polarity is inverted by said second inverting means is a signal based on the output of said low-pass filter means.

3. The feedback control circuit as claimed in claim 1 or 2, constituting a phase-locked loop (PLL).

* * * * *